United States Patent
Song

(10) Patent No.: US 8,536,644 B2
(45) Date of Patent: Sep. 17, 2013

(54) SEMICONDUCTOR DEVICE HAVING A BURIED GATE AND METHOD FOR FORMING THE SAME

(75) Inventor: Hae Il Song, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 98 days.

(21) Appl. No.: 12/978,181

(22) Filed: Dec. 23, 2010

(65) Prior Publication Data

US 2011/0254083 A1    Oct. 20, 2011

(30) Foreign Application Priority Data

Apr. 15, 2010   (KR) .......................... 10-2010-0034755

(51) Int. Cl.
*H01L 29/78*    (2006.01)

(52) U.S. Cl.
USPC .............. 257/330; 257/E29.13; 257/E21.428; 438/270

(58) Field of Classification Search
USPC ........... 257/330, E29.255, E29.127, E29.128, 257/E29.13, E21.409, E21.428; 438/270, 438/589

See application file for complete search history.

(56) References Cited

U.S. PATENT DOCUMENTS

| | | | |
|---|---|---|---|
| 7,804,130 B1 * | 9/2010 | Fung | 257/330 |
| 2003/0072884 A1 * | 4/2003 | Zhang et al. | 427/255.391 |
| 2004/0013803 A1 * | 1/2004 | Chung et al. | 427/255.391 |
| 2008/0203488 A1 * | 8/2008 | Chung et al. | 257/369 |
| 2008/0211057 A1 * | 9/2008 | Lee et al. | 257/520 |

FOREIGN PATENT DOCUMENTS

| | | |
|---|---|---|
| KR | 100831679 B1 | 5/2008 |
| KR | 1020080064372 A | 7/2008 |
| KR | 100855857 B1 | 8/2008 |

* cited by examiner

*Primary Examiner* — Wensing Kuo
(74) *Attorney, Agent, or Firm* — William Park & Associates Patent Ltd.

(57) ABSTRACT

A semiconductor device including a buried gate and a method for forming the same are disclosed. The semiconductor device includes a buffer layer formed on a surface of a trench in a semiconductor substrate, and a gate electrode configured to partially bury the trench and formed of the same material as in the buffer layer.

20 Claims, 3 Drawing Sheets

SEMICONDUCTOR DEVICE HAVING A BURIED GATE AND METHOD FOR FORMING THE SAME

CROSS-REFERENCE TO RELATED APPLICATION

The present application claims priority to Korean patent application number 10-2010-0034755, filed on 15 Apr. 2010, which is incorporated by reference in its entirety.

BACKGROUND OF THE INVENTION

1. Field of the Invention

Embodiments of the present invention relate to a semiconductor device, and more particularly to a semiconductor device including a buried gate and a method for forming the same.

2. Background of the Invention

A dynamic random access memory (DRAM) device includes a plurality of unit cells each having a capacitor and a transistor. The capacitor is used to temporarily store data, and the transistor is used to transfer data between a bit line and the capacitor in response to a control signal (word line). The data transfer occurs by using a semiconductor property where an electrical conductivity changes depending on environments. The transistor has three regions, i.e., a gate, a source, and a drain. Electric charges are moved between the source and the drain according to a control signal inputted to the gate of the transistor. The movement of the electric charges between the source and the drain is achieved through a channel region. The semiconductor property is used in the channel.

In a typical method for manufacturing a transistor, a gate is formed in a semiconductor substrate, and a source and a drain are formed by doping impurities into both sides of the gate. In this case, a channel region of the transistor is defined between the source and the drain under the gate. The transistor having a horizontal channel region occupies a predetermined area of a semiconductor substrate. Therefore, for a given transistor, the number of memory cells may determine the size of the semiconductor device.

If the total area of the semiconductor memory device is reduced, the number of semiconductor memory devices per wafer is increased, thereby improving the productivity. Several methods for reducing the total area of the semiconductor memory device have been proposed. One method is to replace a conventional planar gate having a horizontal channel region by a recess gate in which a recess is formed in a substrate and a channel region is formed along a curved surface of the recess by forming a gate in the recess. Furthermore, a buried gate has been studied which can reduce a parasitic capacitance of a bit line by burying the entire gate within the recess.

FIG. 1 is a cross-sectional view illustrating a method for forming a semiconductor device according to the related art.

Referring to FIG. 1, a trench T for defining a prearranged buried gate region is formed by defining a semiconductor substrate 10 including an active region defined by a device isolation layer. A gate insulating film 12 is formed on the bottom and inner lateral surface of the trench T.

Subsequently, a barrier film 14 and a gate electrode 16 are formed over the gate insulating film 12. The gate electrode 16, the barrier film 14 and the gate insulating film 12 are then etched back so that a buried gate is formed. In general, the barrier film 14 is formed of titanium nitride (TiN), and the gate electrode 16 is formed of tungsten (W). The TiN film acting as the barrier film 14 requires a long period of fabrication time, resulting in low productivity. Since the barrier film 14 and the gate electrode 16 are formed of different metals, it is difficult to simultaneously etch back the barrier film 14 and the gate electrode 16.

Accordingly, in order to simplify a fabrication process, the barrier film 14 and the gate electrode 16 may be formed of the same material, and the fabrication difficulty in etching back the barrier film 14 and the gate electrode 16 can be reduced. However, a material proposed for the barrier film 14 and the gate electrode 16 that are formed of the same material has a disadvantage in that the gate insulating film 12 is deteriorated. Specifically, since the proposed material is high in chlorine (Cl) (e.g., Cl=1.3%), chlorine (Cl) is oxidized by a thermal process so that the gate electrode 16 has higher resistance. Although a typical method which increases a temperature and reduces a deposition time during a thermal process so as to reduce the Cl content has been proposed, a nitridation time required for a process reducing chlorine (Cl) is increased so that the overall process time is increased and it is difficult for the barrier film 14 and the gate electrode 16 to be formed of the same material.

BRIEF SUMMARY OF THE INVENTION

Various embodiments of the present invention are directed to providing a semiconductor device and a method for forming the same that substantially obviate one or more problems due to limitations and disadvantages of the related art.

According to an embodiment of the present invention, there is provided a semiconductor device which prevents resistance of a gate electrode from being increased and also prevents a gate insulating film from being deteriorated when a buried gate is configured in the form of a single layer, resulting in simplified formation of a buried gate. Further, a semiconductor device includes a buffer layer formed over a surface of a trench formed in a semiconductor substrate, and a gate electrode configured to be partially buried in the trench and formed of the same material as in the buffer layer.

The semiconductor device may further include a gate insulating film configured to be arranged below the buffer layer.

The buffer layer and the gate electrode may include titanium nitride (TiN).

The buffer layer may have chlorine (Cl) content lower than that of the gate electrode.

The buffer layer may have chlorine (Cl) content of substantially 0.1% to substantially 0.3%.

The gate electrode may have chlorine (Cl) content of substantially 0.8% to substantially 1.0%.

In accordance with another aspect of the present invention, a method for forming a semiconductor device includes forming a buffer layer on a surface of a trench in a semiconductor substrate, and forming a gate electrode which partially buries the trench and is formed of the same material as in the buffer layer.

The method may further include forming a gate insulating film over the trench surface prior to forming the buffer layer.

The forming of the buffer layer may be formed by a Sequential Flow Deposition (SFD) process.

The forming of the buffer layer may be performed at a temperature of substantially 670° to substantially 690°.

The forming of the buffer layer may include performing a purging action, depositing a TiN film, performing the purging action, and flowing $NH_3$.

The depositing of the TiN film may be carried out in gas flow atmosphere of $TiCl_4$ and $NH_3$.

The depositing of the TiN film may include adjusting flow of $TiCl_4$ and flow of $NH_3$ to have the same ratio.

The depositing of the TiN film may include adjusting chlorine (Cl) content to be substantially 0.1% to substantially 0.3%.

The forming of the gate electrode may be carried out in-situ after formation of the buffer layer.

The formatting of the gate electrode may be carried out by a sequential flow deposition (SFD) process.

The forming of the gate electrode may be performed at a temperature of substantially 670° to substantially 690°.

The forming of the gate electrode may include performing a purging action, depositing a TiN film, performing the purging action, and flowing $NH_3$.

The depositing of the TiN film may be carried out in gas flow atmosphere of $TiCl_4$ and $NH_3$.

The depositing of the TiN film may include adjusting chlorine (Cl) content to be substantially 0.8% to substantially 1.0%.

The method may further include simultaneously etching back the buffer layer and the gate electrode.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
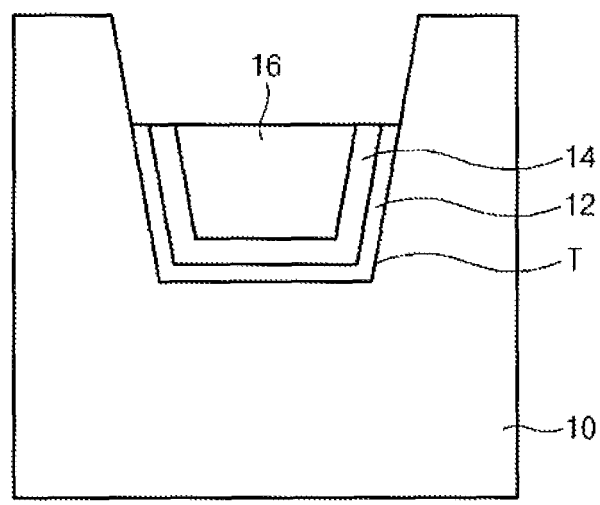
FIG. 1 is a cross-sectional view illustrating a semiconductor device according to the related art.
Figure 2:
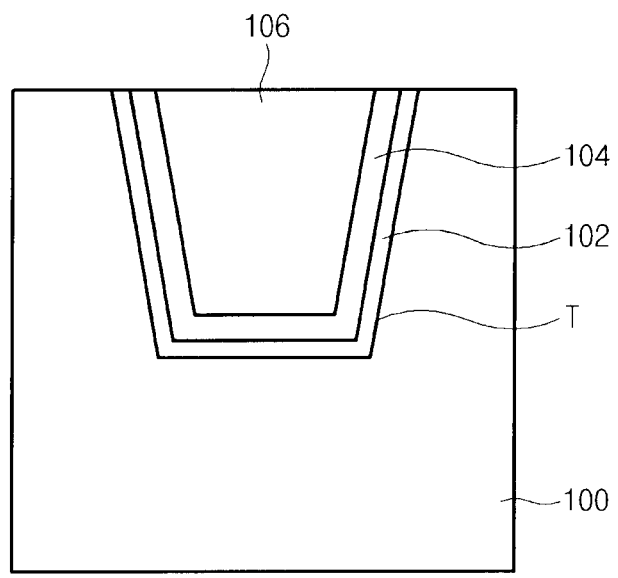
FIG. 2 is a cross-sectional view illustrating a semiconductor device according to an embodiment of the present invention.
Figure 3A:
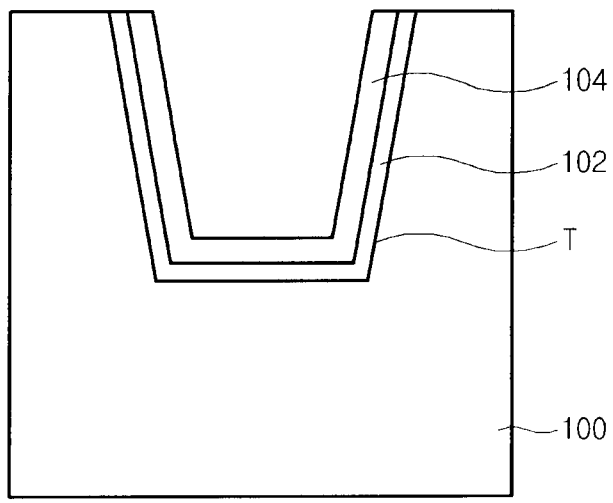
FIGS. 3A and 3B are a cross-sectional view illustrating a method for forming a semiconductor device according to an embodiment of the present invention.
Figure 3B:
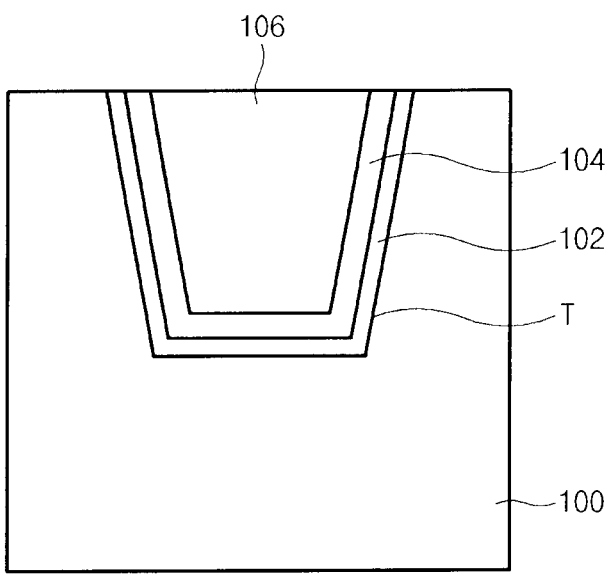

FIG. 2 is a cross-sectional view illustrating a semiconductor device according to an embodiment of the present invention. FIGS. 3A and 3B are a cross-sectional view illustrating a method for forming a semiconductor device according to an embodiment of the present invention.

Referring to FIG. 2, the semiconductor device according to the present invention includes a buried gate. The buried gate is formed by a gate insulating film 102 formed over a semiconductor substrate 100, a buffer layer 104 formed over the gate insulating film 102, and a gate electrode 106. In this case, each of the buffer layer 104 and the gate electrode 106 may be configured in a single layer. Each of the buffer layer 104 and the gate electrode 106 may include, for example, TiN film. The buffer layer 104 may comprise, for example, TiN film having chlorine (Cl) content of 0.1% to 0.3%, and the gate electrode 106 may comprise, for example, TiN film having chlorine (Cl) content of 0.8% to 1.0%. In order to increase interfacial adhesive property with the gate insulating film 102, the buffer layer 104 may be formed of a material that has Cl content lower than that of the gate electrode 106.

If the Cl content is high, it may be necessary to increase a nitridation time to reduce the Cl content. Accordingly, some embodiments of the invention may form the gate electrode 106 at a condition capable of reducing fabrication time. A detailed description thereof will hereinafter be described with reference to FIGS. 3A and 3B.

Referring to FIG. 3A, a gate insulating film 102 and a buffer layer 104 are located in the trench T formed in the semiconductor substrate 100.

The buffer layer 104 may be formed, for example, according to a Sequential Flow Deposition (SFD) scheme. In more detail, the SFD scheme may be designed to repeat the purging step, the depositing step of a TiN film, the purging step, and the flowing step of $NH_3$. The SFD scheme may be carried out at, for example, a temperature of 670° to 690°. The TiN film may be deposited in gas flow atmosphere of, for example, $TiCl_4$ and $NH_3$. The flow of $TiCl_4$ may be in the range of, for example, 50 sccm to 70 sccm. The flow of $NH_3$ may also be in the range of, for example, 50 sccm to 70 sccm in the same manner as in the flow of $TiCl_4$. In addition, the depositing step of the TiN film may be carried out, for example, for 2.5 to 3.5 seconds. The flowing step of $NH_3$ may be carried out, for example, for 7 to 9 seconds.

The TiN film may have, for example, Cl content of 0.1% to 0.3%. In this case, the Cl content may be derived on the assumption that the sum of all element components detected by analyzing the TiN film using an Atomic Emission Spectrometer (AES) is represented by 100%. For example, assuming that the AES analysis result of the TiN film includes 45% titanium (Ti), 45% nitrogen (N), 5% chlorine (Cl), and 5% oxygen (O), this means that the Cl content is 5%. The Cl content of 0.1% to 0.3% according to the embodiment of the present invention is disclosed only for illustrative purposes, and is not limited thereto, so that it may also be represented by other values as necessary. Similarly, the various specifications stated above for the SFD scheme—temperature, the gas flow atmosphere, gas flow rate, etc.—are exemplary values. The invention is not limited to the above examples.

Referring to FIG. 3B, the gate electrode 106 is formed over the buffer layer 104. The gate electrode 106 may be formed using the SFD scheme in the same manner as for the buffer layer 104. The gate electrode 106 may be formed in-situ with the buffer layer 104. In this case, "in-situ" means that objective elements are simultaneously formed within one chamber without taking a wafer out of the chamber. Accordingly, when forming the buffer layer 104 and the gate electrode 106 according to various embodiment of the present invention, In-and-Out (I/O) actions of the wafer (i.e., insertion and removal of the wafer from the chamber) can be reduced such that a fabrication process can be effectively simplified. As a result, the 'in-situ' process used in various embodiments of the present invention may decrease fabrication time of the semiconductor device. In addition, the in-situ process is sequentially performed within one chamber, such that it can basically prevent an oxide layer from being generated on the surface of a thin film during the insertion and removal of the wafer from the chamber. As a result, the semiconductor device's interfacial property may improve.

In more detail, the gate electrode 106 may be formed by repeating the purging step, the depositing step of a TiN film, the purging step, and the flowing step of $NH_3$. The gate electrode 106 may be formed at, for example, 670° to 690°. The gate electrode 106 may be deposited in gas flow atmosphere of, for example, $TiCl_4$ and $NH_3$. The flow of $TiCl_4$ may be in the range of, for example, 50 sccm to 70 sccm. The flow of $NH_3$ may be in the range of, for example, 170 sccm to 190 sccm. In addition, the depositing step of the TiN film may be carried out, for example, for 2.5 to 3.5 seconds. The flowing step of $NH_3$ may be carried out, for example, for 7 to 9 seconds, the TiN film acting as the gate electrode 106 may have the Cl content of, for example, 0.8% to 1.0%. In this case, an amount of the Cl content contained in the TiN film is higher than that of the buffer layer 104, such that it is preferable that the flow of $NH_3$ be set to be higher than the flow of $TiCl_4$.

Thereafter, although not shown in the drawings, the buffer layer 104 and the gate electrode 106 are etched back so that a trench formed in the semiconductor substrate is partially buried. In the related art, TiN applied as a buffer layer and W applied as a gate electrode are different from each other, such that a planarization etching process must be performed before the etch-back process for burying some parts of the trench. However, according to various embodiments of the present invention, since the buffer layer and the gate electrode are each formed in one layer, the planarization etching process need not be performed. Accordingly, various embodiments of the present invention may simplify fabrication of a semiconductor device, thereby reducing overall fabrication time.

As apparent from the above description, the semiconductor device and the method for forming the same according to the embodiment of the present invention have the following effects.

Various embodiments of the present invention may adjust the Cl content at a low level so as to maintain favorable interfacial adhesive property with the gate insulating film, and forms the buffer layer and the gate electrode from the same material so as to omit a planarization etching process, resulting in simplified fabrication process.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a buffer layer on a surface of a trench in a semiconductor substrate; and
   a gate electrode fully buried in the trench, and comprising same material as in the buffer layer
   wherein the buffer layer has chlorine (Cl) content lower than that of the gate electrode.

2. The semiconductor device according to claim 1, further comprising a gate insulating film below the buffer layer.

3. The semiconductor device according to claim 1, wherein the buffer layer and the gate electrode include titanium nitride (TiN).

4. The semiconductor device according to claim 1, wherein the buffer layer has chlorine (Cl) content of substantially 0.1% to substantially 0.3%.

5. The semiconductor device according to claim 1, wherein the gate electrode has chlorine (Cl) content of substantially 0.8% to substantially 1.0%.

6. A method for forming a semiconductor device comprising:
   forming a buffer layer on a surface of a trench in a semiconductor substrate; and
   forming a gate electrode which is fully buried in the trench and comprises the same material as in the buffer layer
   wherein the buffer layer has chlorine (Cl) content lower than that of the gate electrode.

7. The method according to claim 6, further comprising forming a gate insulating film over the trench surface prior to forming the buffer layer.

8. The method according to claim 6, wherein the forming of the buffer layer comprises a Sequential Flow Deposition (SFD) process.

9. The method according to claim 6, wherein the forming of the buffer layer is performed at a temperature of substantially 670° to substantially 690°.

10. The method according to claim 7, wherein the forming of the buffer layer includes:
    performing a purging action;
    depositing a TiN film;
    performing the purging action; and
    flowing $NH_3$.

11. The method according to claim 10, wherein the depositing of the TiN film is carried out in gas flow atmosphere of $TiCl_4$ and $NH_3$.

12. The method according to claim 11, wherein the depositing of the TiN film includes adjusting flow of $TiCl_4$ and flow of $NH_3$ to have substantially the same ratio.

13. The method according to claim 10, wherein the depositing of the TiN film includes adjusting a chlorine (Cl) content to be substantially 0.1 % to substantially 0.3%.

14. The method according to claim 6, wherein the forming of the gate electrode is in-situ after forming the buffer layer.

15. The method according to claim 6, wherein the forming of the gate electrode comprises a sequential flow deposition (SFD) process.

16. The method according to claim 6, wherein the forming of the gate electrode is performed at a temperature of substantially 670° to substantially 690°.

17. The method according to claim 6, wherein the forming of the gate electrode includes:
    performing a purging action;
    depositing a TiN film;
    performing the purging action; and
    flowing $NH_3$.

18. The method according to claim 17, wherein the depositing of the TiN film is carried out in gas flow atmosphere of $TiCl_4$ and $NH_3$.

19. The method according to claim 17, wherein the depositing of the TiN film includes adjusting a chlorine (Cl) content to be substantially 0.8% to substantially 1.0%.

20. The method according to claim 6, further comprising simultaneously etching back the buffer layer and the gate electrode.

* * * * *